US012744468B2

(12) United States Patent
Guan et al.

(10) Patent No.: US 12,744,468 B2
(45) Date of Patent: Sep. 22, 2026

(54) HIGH-POWER-DENSITY MODULAR ENERGY STORAGE CONVERTER

(71) Applicant: JINGTSING TECHNOLOGY LTD, Beijing (CN)

(72) Inventors: Eryong Guan, Beijing (CN); Dongyang Wang, Beijing (CN)

(73) Assignee: JINGTSING TECHNOLOGY LTD, Beijing (CN)

( * ) Notice: Subject to any disclaimer, the term of this patent is extended or adjusted under 35 U.S.C. 154(b) by 395 days.

(21) Appl. No.: 18/697,644

(22) PCT Filed: Dec. 23, 2022

(86) PCT No.: PCT/CN2022/141278
§ 371 (c)(1),
(2) Date: Apr. 1, 2024

(87) PCT Pub. No.: WO2024/130681
PCT Pub. Date: Jun. 27, 2024

(65) Prior Publication Data
US 2025/0233525 A1 Jul. 17, 2025

(51) Int. Cl.
*H02M 7/00* (2006.01)
*H02M 1/12* (2006.01)
(Continued)

(52) U.S. Cl.
CPC ........... *H02M 7/003* (2013.01); *H02M 1/126* (2013.01); *H05K 5/0217* (2013.01); *H05K 5/0247* (2013.01); *H05K 7/20927* (2013.01)

(58) Field of Classification Search
CPC ..... H02B 1/56; H02J 3/32; H02J 7/70; H02M 1/00; H02M 1/126; H02M 7/00;
(Continued)

(56) References Cited

U.S. PATENT DOCUMENTS

2006/0050483 A1* 3/2006 Wilson .................. H10W 40/47 361/689
2013/0322016 A1* 12/2013 Jones ................ H05K 7/14325 361/689
(Continued)

FOREIGN PATENT DOCUMENTS

CN 103460826 A 12/2013
CN 10639951 A 1/2017
(Continued)

OTHER PUBLICATIONS

Supplementary European search report dated Jul. 25, 2025 received in European Patent Application No. 22965370.4.
(Continued)

*Primary Examiner* — Timothy J Thompson
*Assistant Examiner* — Rhadames Alonzo Miller
(74) *Attorney, Agent, or Firm* — Scully, Scott, Murphy & Presser, P.C.

(57) ABSTRACT

A high-power-density modular energy storage converter is provided. The converter includes a cabinet divided into a first region, a second region and a third region. The cabinet includes a foundation slab, a front structure, a middle structure and a rear structure. The front structure is arranged in the first region. The middle structure is arranged in the second region. The rear structure is arranged in the third region. The front structure includes a power device and a first air-water heat exchanger. The middle structure includes an electric reactor device, a DC magnetic ring device, an AC magnetic ring device and an AC filter capacitor. The rear structure includes a DC contactor, an AC circuit breaker, an AC pluggable connector, a DC fast fuse device and a DC pluggable connector.

20 Claims, 4 Drawing Sheets

(51) Int. Cl.
*H05K 5/02* (2006.01)
*H05K 7/20* (2006.01)

(58) Field of Classification Search
CPC ... H02M 7/003; H05K 5/0217; H05K 5/0247; H05K 7/14325; H05K 7/20927
See application file for complete search history.

(56) References Cited

U.S. PATENT DOCUMENTS

| | | | | |
|---|---|---|---|---|
| 2014/0035289 A1* | 2/2014 | Eichler | F03D 80/82 290/55 |
| 2014/0036418 A1* | 2/2014 | Eichler | F03D 80/82 361/605 |
| 2015/0250074 A1* | 9/2015 | Matsumoto | H05K 7/20336 165/104.21 |
| 2022/0271515 A1* | 8/2022 | Zheng | H02B 1/28 |

FOREIGN PATENT DOCUMENTS

| | | |
|---|---|---|
| CN | 206585455 U | 10/2017 |
| CN | 110380622 A | 10/2019 |
| CN | 210075867 U | 2/2020 |
| CN | 112706631 A | 4/2021 |
| DE | 202015105878 U1 | 11/2015 |

OTHER PUBLICATIONS

International search report dated Jun. 23, 2023 received in International Application No. PCT/CN2022/141278.

* cited by examiner

HIGH-POWER-DENSITY MODULAR ENERGY STORAGE CONVERTER

CROSS-REFERENCE TO RELATED APPLICATION

This application is a National Stage Entry under 35 U.S.C. § 371 of PCT International Application No. PCT/CN2022/141278, filed on Dec. 23, 2022, the entire contents of which are herein incorporated by reference.

FIELD

The present disclosure relates to the field of energy storage converters, and particularly relates to a high-power-density modular energy storage converter.

BACKGROUND

In the related art, an energy storage converter adopts a way of air cooling to cool internal components, while the power density per unit volume is not high. With the large-scale application of container energy storage, the space provided for the energy storage converter is getting smaller and smaller, and the requirement on unit energy density is higher. Therefore, conventional air-cooled energy storage converters can no longer meet requirements, especially on some high-end application occasions; it is urgent to develop an energy storage converter with a compact structure and a high-power-density.

SUMMARY

In order to solve or improve the problems in the related art that the structure of an energy storage converter is not compact and the power density thereof is not high, the purpose of the present disclosure lies in proposing a high-power-density modular energy storage converter.

In order to achieve the above purpose, the present disclosure provides a high-power-density modular energy storage converter, comprising: a cabinet which is divided into a first region, a second region and a third region, wherein the first region, the second region and the third region are arranged successively along a first direction, and the cabinet comprises: a foundation slab, wherein at least a portion of the foundation slab is arranged in the first region, at least a portion of the foundation slab is arranged in the second region, and at least a portion of the foundation slab is arranged in the third region; a front structure, arranged in the first region, wherein the front structure comprises: a power device, connected to the foundation slab; and a first air-water heat exchanger, connected to the power device; a middle structure, arranged in the second region, wherein the middle structure comprises: an electric reactor device, connected to the side wall of the cabinet, wherein the electric reactor device is connected to the power device; a DC magnetic ring device, connected to the foundation slab; an AC magnetic ring device, connected to the foundation slab, wherein the AC magnetic ring device is connected to the electric reactor device; an AC filter capacitor, connected to the foundation slab, wherein the AC filter capacitor is connected to the AC magnetic ring device, and the AC filter capacitor is connected to the electric reactor device; a rear structure, arranged in the third region, wherein the rear structure comprises: a DC contactor, connected to the foundation slab, wherein the DC contactor is connected to the power device through a first copper bar, and the first copper bar penetrates through the DC magnetic ring device; an AC circuit breaker, connected to the foundation slab, wherein the AC circuit breaker is connected to the AC magnetic ring device; an AC pluggable connector, connected to the cabinet, wherein the AC pluggable connector is connected to the AC circuit breaker; a DC fast fuse device, connected to the DC contactor; and a DC pluggable connector, connected to the cabinet, wherein the DC pluggable connector is connected to the DC fast fuse device.

According to the technical solution of the high-power-density modular energy storage converter provided by the present disclosure, firstly, the cabinet is divided into the first region, the second region and the third region, and the front structure, the middle structure and the rear structure are respectively arranged in the corresponding regions, by optimizing the spatial layout, the structures and the components become more compact therebetween, which is beneficial for reducing the overall volume of the energy storage converter and improving the power density per unit volume; secondly, through replacing a conventional air-cooling structure with the air-water heat exchanger, and replacing a disconnector and a contactor in a conventional structure with the AC circuit breaker, the structure of the energy storage converter is more compact, and this helps further reduce the overall volume of the energy storage converter, and improve the power density of unit volume.

An energy storage converter (PCS, Power Conversion System) can control the charging and discharging process of a battery, conduct conversions of AC and DC, and can directly supply power for an AC load in the case of no power grid.

Specifically, the high-power-density modular energy storage converter comprises the cabinet, the front structure, the middle structure and the rear structure. Wherein, the cabinet is divided into the first region, the second region and the third region. The first region, the second region and the third region are arranged successively along the first direction. The front structure is arranged in the first region of the cabinet; the middle structure is arranged in the second region of the cabinet; the rear structure is arranged in the third region of the cabinet. The second region is located between the first region and the third region, and therefore, the middle structure is located between the front structure and the rear structure. Optionally, the first direction is a length direction of the cabinet. The cabinet is arranged in a transverse direction. The front structure, the middle structure and the rear structure are arranged successively along the length direction of the cabinet.

Furthermore, the cabinet comprises the foundation slab. At least a portion of the foundation slab is arranged in the first region. At least a portion of the foundation slab is arranged in the second region. At least a portion of the foundation slab is arranged in the third region. In the foundation slab, at least a portion is arranged in the first region of the cabinet, at least a portion is arranged in the second region of the cabinet and at least a portion is arranged in the third region of the cabinet.

Furthermore, the front structure is arranged in the first region of the cabinet. The front structure comprises the power device and the first air-water heat exchanger. Specifically, the power device is connected to the foundation slab. Optionally, the power device is detachably connected to the foundation slab, so as to help an operator to assemble and disassemble the power device. The power device is a device formed by the combination of power electronic devices according to certain functions. The first air-water heat exchanger is connected to the power device. The first air-water heat exchanger conducts heat dissipation to the components (especially the power device) in the front structure in the form of exchanging heat between the air and the water. Optionally, the front structure is an operation panel section of the high-power-density modular energy storage converter, and the core component of the high-power-density modular energy storage converter. The power device and the first air-water heat exchanger form a whole through a first connecting member and are fixed to the foundation slab. Optionally, the first connecting member is a screw or other structures for connection. Optionally, the front structure is arranged symmetrically, and this can ensure the interchangeability between each product.

Furthermore, the middle structure is arranged in the second region of the cabinet. The middle structure comprises the electric reactor device, the DC magnetic ring device, the AC magnetic ring device and the AC filter capacitor. Specifically, the electric reactor device is connected to the side wall of the cabinet. The electric reactor device is connected to the power device. An electric reactor is also called an inductor, and widely applied in circuits; due to the effect of electromagnetic induction, the electric reactor has certain inductance, has a function of preventing current changes, and can transform electrical energy into magnetic energy and store the same. Furthermore, the DC magnetic ring device is connected to the foundation slab. The AC magnetic ring device is connected to the foundation slab. The AC magnetic ring device is connected to the electric reactor device. Optionally, the DC magnetic ring device is connected to the foundation slab through its own fixing plate, and the fixing plate is detachably connected to the foundation slab through a second connecting member. Optionally, the second connecting member is a screw or other structures for connection. Optionally, the middle structure further comprises a first supporting member. The first supporting member is connected to the side wall of the cabinet. The electric reactor device is connected to the first supporting member through a third connecting member. Optionally, the first supporting member is a supporting corner piece. Optionally, the third connecting member is a bolt or other structures for connection. Optionally, the AC magnetic ring device is connected to the foundation slab through a second supporting member. Optionally, the second supporting member is an insulation piece, and can be a structure such as a rubber block. Furthermore, the AC filter capacitor is connected to the foundation slab. The AC filter capacitor is connected to the AC magnetic ring device, and the AC filter capacitor is connected to the electric reactor device. The AC filter capacitor indicates a filter device mounted at the AC side of an inverter and used for filtering high-order harmonic generated by the inverter, and the AC filter capacitor and the electric reactor jointly constitute an LC filter. Through disposing the LC filter, the total harmonic content generated by the inverter can be decreased. Optionally, the AC filter capacitor is connected to a third copper bar between the AC magnetic ring device and the electric reactor device through a cable.

Furthermore, the rear structure is arranged in the third region of the cabinet. The rear structure comprises the DC contactor, the AC circuit breaker, the AC pluggable connector, the DC fast fuse device and the DC pluggable connector. Specifically, the DC contactor is connected to the foundation slab. The DC contactor is connected to the power device through the first copper bar. The first copper bar penetrates through the DC magnetic ring device. The DC contactor is designed especially for breaking off the DC. When the DC is broken off, the arc light does not have temporary extinguishing when the AC crosses zero, and thus a special device for extinguish the arc light is designed inside the DC contactor. The first copper bar is connected to the power device through a fourth connecting member, and the first copper bar is connected to the DC contactor through the fourth connecting member. Optionally, the fourth connecting member is a bolt or other structures for connection.

Furthermore, the AC circuit breaker is connected to the foundation slab. The AC circuit breaker is connected to the electric reactor device. The AC circuit breaker is connected to the AC magnetic ring device. The AC circuit breaker is a device for protecting its outlet, and cuts off a fault current when the outlet side fails. Optionally, the AC magnetic ring device has a second copper bar. The electric reactor device is connected to the second copper bar through at least one copper bar structure. The AC circuit breaker is connected to the second copper bar.

Furthermore, the AC pluggable connector is connected to the cabinet. The AC pluggable connector is connected to the AC circuit breaker. Optionally, the AC pluggable connector and the AC circuit breaker are connected to each other through a first soft connection and form an AC lead-in return circuit. A soft connection is a copper braided wire soft connection or a copper braided belt soft connection. Furthermore, the DC fast fuse device is connected to the DC contactor. The DC fast fuse device is a fast fuse. The fast fuse is used for overcurrent and short circuit protection, and can be quickly disconnected in the case of fuse overload. Furthermore, the DC pluggable connector is connected to the cabinet. The DC contactor, the fast fuse and the DC pluggable connector constitute the DC lead-in return circuit.

In the technical solution defined in the present disclosure, firstly, the cabinet is divided into the first region, the second region and the third region, and the front structure, the middle structure and the rear structure are respectively arranged in the corresponding regions, by optimizing the spatial layout, the structures and the components become more compact therebetween, which is beneficial for reducing the overall volume of the energy storage converter and improving the power density per unit volume; secondly, through replacing a conventional air-cooling structure with the air-water heat exchanger, and replacing a disconnector and a contactor in a conventional structure with the AC circuit breaker, the structure of the energy storage converter is more compact, and this helps further reduce the overall volume of the energy storage converter, and improve the power density of unit volume. The power density (power-to-weight ratio) refers to the ratio of the output power of the battery to its weight.

In addition, the above technical solution provided by the present disclosure can further have the following additional features:

In some technical solutions, optionally, the AC magnetic ring device comprises the second copper bar, the second copper bar is connected to the electric reactor device, and the second copper bar is connected to the AC circuit breaker.

In the technical solution, through disposing the second copper bar, it is convenient for an operator to assemble and disassemble the AC magnetic ring device with the electric reactor device, and to assemble and disassemble the AC magnetic ring device with the AC circuit breaker.

In some technical solutions, optionally, the electric reactor device is connected to the AC magnetic ring device through the third copper bar, and the AC filter capacitor is connected to the third copper bar via a cable.

In the technical solution, through disposing the third copper bar, it is achieved that the electric reactor device, the AC magnetic ring device and the AC filter capacitor are in a connected state.

In some technical solutions, optionally, the rear structure further comprises: a second air-water heat exchanger, which is connected to the side wall of the cabinet through a lightning protection mounting plate.

In the technical solution, the rear structure further comprises the second air-water heat exchanger. Specifically, the second air-water heat exchanger is connected to the side wall of the cabinet through the lightning protection mounting plate. The second air-water heat exchanger conducts heat dissipation to the components in the rear structure in the form of exchanging heat between the air and the water.

In some technical solutions, optionally, the number of the power device is at least one.

In the technical solution, there can be one, two or multiple power devices, and the power device can be arranged flexibly according to actual needs.

In some technical solutions, optionally, the high-power-density modular energy storage converter further comprises: a liquid-cooled cooling pipeline system, connected to the power device, wherein the liquid-cooled cooling pipeline system is connected to the electric reactor device.

In the technical solution, the high-power-density modular energy storage converter further comprises the liquid-cooled cooling pipeline system. Specifically, the liquid-cooled cooling pipeline system is connected to the power device. The liquid-cooled cooling pipeline system is connected to the electric reactor device. The liquid-cooled cooling pipeline system communicates with the power device and the electric reactor device to cool them. The liquid-cooled cooling pipeline system, and the first air-water heat exchanger, the second air-water heat exchanger and an air duct partition which are responsible for internal circulation constitute an internal air-cooling circulation loop, and then the ambient temperature for air operation inside the energy storage converter is maintained. Each component is in a suitable environmental condition to ensure that it does not produce power reduction due to temperature changes. Through optimizing the internal air duct, the air circulation is smoother, and this effectively lowers the ambient temperature inside the energy storage converter, and enables the components to work effectively.

In some technical solutions, optionally, the electric reactor device is connected to the side wall of the cabinet through the first supporting member.

In the technical solution, the middle structure further comprises the first supporting member. The first supporting member is connected to the side wall of the cabinet. The electric reactor device is connected to the first supporting member via the third connecting member. Optionally, the first supporting member is the supporting corner piece. Optionally, the third connecting member is a bolt or other members for connection.

In some technical solutions, optionally, the AC magnetic ring device is connected to the foundation slab via the second supporting member.

In the technical solution, the middle structure further comprises the second supporting member. The second supporting member is connected to the foundation slab. The AC magnetic ring device is connected to the second supporting member. Through disposing the second supporting member, it helps improve the connection strength between the AC magnetic ring device and the foundation slab.

In some technical solutions, optionally, the DC fast fuse device is connected to the DC contactor via a fourth copper bar.

In the technical solution, through disposing the fourth copper bar, the connection between the DC fast fuse device and the DC contactor can be achieved. In some technical solutions, optionally, the AC pluggable connector is connected to the AC circuit breaker through the first soft connection.

In the technical solution, through disposing the first soft connection, it can prevent the copper braided belt or a copper braided wire from interfering other components, and ensure that the AC pluggable connector and the AC circuit breaker are in a connected state.

The additional aspects and advantages of the present disclosure will be obvious in the following description, or can be understood through the practice of the present disclosure.

Wherein, the corresponding relations between the reference signs and the component names in FIG. 1 to FIG. 6 are as follow:

100: high-power-density modular energy storage converter, 110: cabinet, 111: first region, 112: second region, 113: third region, 114: foundation slab, 120: front structure, 121: power device, 122: first air-water heat exchanger, 130: middle structure, 131: electric reactor device, 132: DC magnetic ring device; 133: AC magnetic ring device, 134: second copper bar, 135: AC filter capacitor, 140: rear structure, 141: DC contactor, 142: AC circuit breaker, 143: second air-water heat exchanger, 144: AC pluggable connector, 145: DC pluggable connector, 146: DC fast fuse device, 147: lightning protection mounting plate, 151: first copper bar, 152: first soft connection, 153: third copper bar, 154: fourth copper bar, and 160: liquid-cooled cooling pipeline system.

DETAILED DESCRIPTION OF THE DISCLOSURE

To more clearly understand the above purposes, features and advantages of the present disclosure, the present disclosure will be further detailed hereinafter in combination with the accompanying drawings and embodiments. It should be indicated that in the case of no conflict, the embodiments and the features in the embodiments of the present disclosure can be combined with each other.

Many details are illustrated in the following description for the convenience of a thorough understanding to the present disclosure, but the present disclosure can further be implemented using other embodiments other than these described herein. Therefore, the protection scope of the present disclosure is not limited to the specific embodiments disclosed in the following text.

A high-power-density modular energy storage converter 100 according to some embodiments of the present disclosure are described in the following by referring to FIG. 1 to FIG. 6.

An energy storage converter (PCS, Power Conversion System) can control the charging and discharging process of a battery, conduct conversions of AC and DC, and can directly supply power for an AC load in the case of no power grid.

Figure 1:
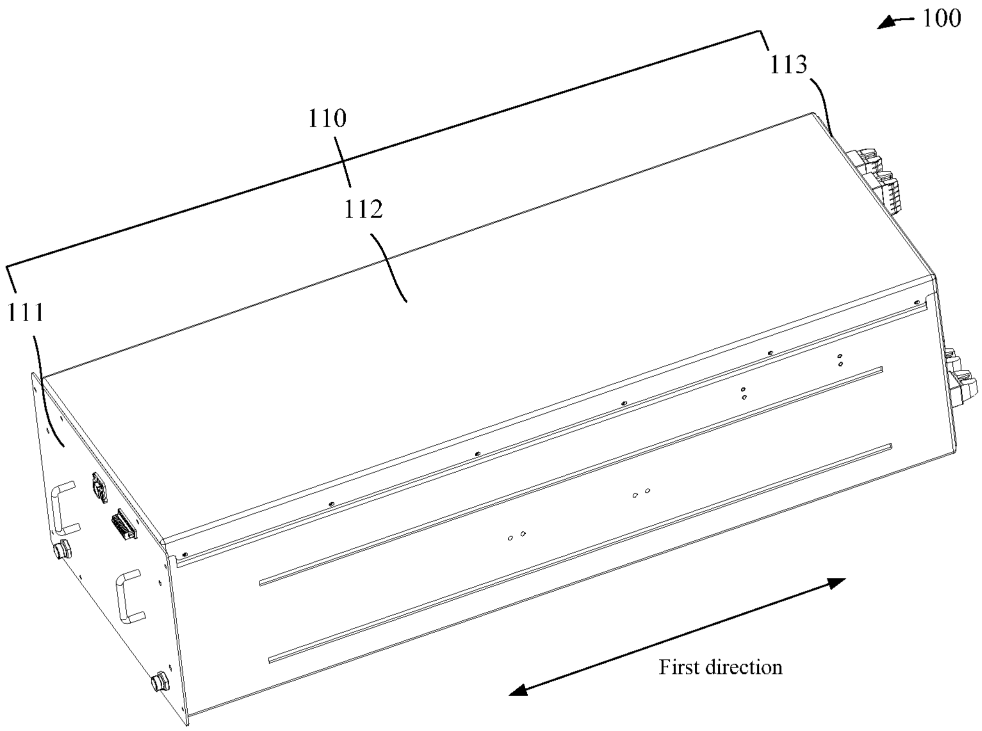
FIG. 1 is a first schematic view of a high-power-density modular energy storage converter according to an embodiment of the present disclosure.
Figure 2:
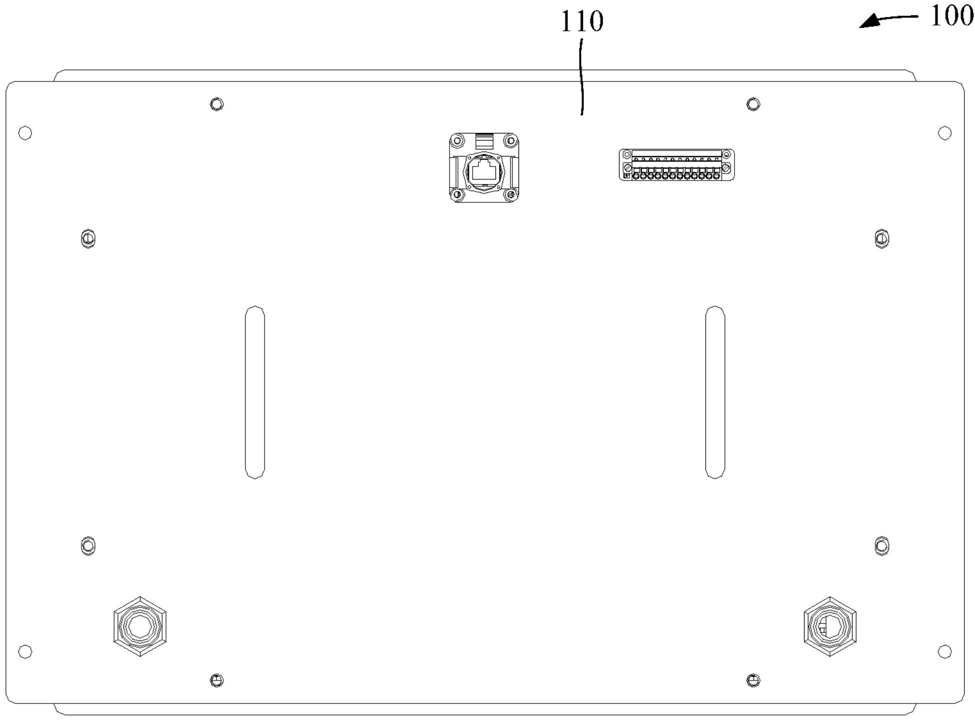
FIG. 2 is a second schematic view of a high-power-density modular energy storage converter according to an embodiment of the present disclosure.

In an embodiment according to the present disclosure, as shown in FIG. 1, FIG. 2, FIG. 3, FIG. 4, FIG. 5 and FIG. 6, the high-power-density modular energy storage converter 100 comprises a cabinet 110, a front structure 120, a middle structure 130 and a rear structure 140. As shown in FIG. 1, the cabinet 110 is divided into a first region 111, a second region 112 and a third region 113. The first region 111, the second region 112 and the third region 113 are arranged successively along a first direction. The front structure 120 is arranged in the first region 111 of the cabinet 110; the middle structure 130 is arranged in the second region 112 of the cabinet 110; the rear structure 140 is arranged in the third region 113 of the cabinet 110. The second region 112 is located between the first region 111 and the third region 113, and therefore, the middle structure 130 is located between the front structure 120 and the rear structure 140. Optionally, the first direction is a length direction of the cabinet 110. The cabinet 110 is arranged in a transverse direction. The front structure 120, the middle structure 130 and the rear structure 140 are arranged successively along the length direction of the cabinet 110.

Furthermore, the cabinet 110 comprises the foundation slab 114. At least a portion of the foundation slab 114 is arranged in the first region 111. At least a portion of the foundation slab 114 is arranged in the second region 112. At least a portion of the foundation slab 114 is arranged in the third region 113. In the foundation slab 114, at least a portion is arranged in the first region 111 of the cabinet 110, at least a portion is arranged in the second region 112 of the cabinet 110 and at least a portion is arranged in the third region 113 of the cabinet 110.

Figure 3:
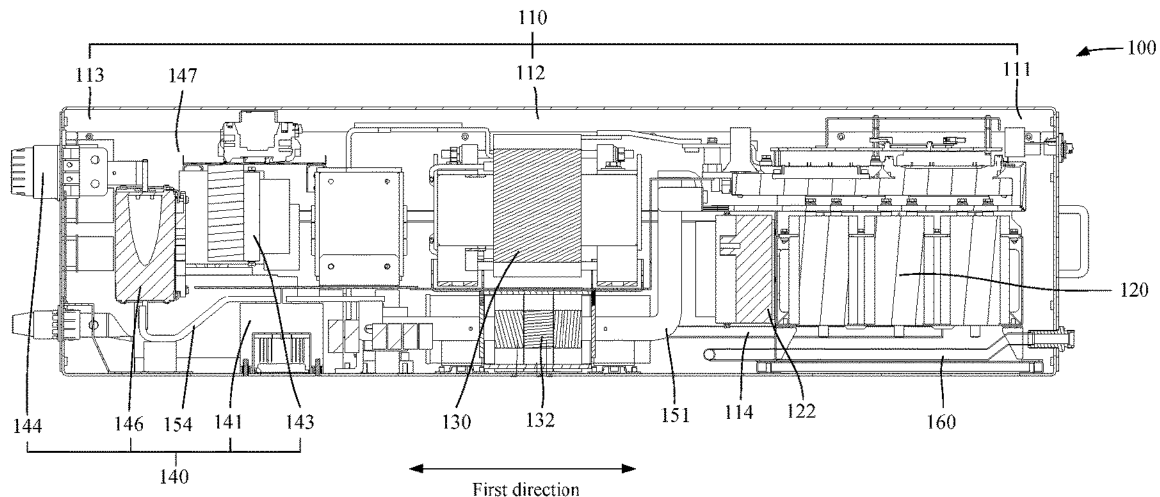
FIG. 3 is a third schematic view of a high-power-density modular energy storage converter according to an embodiment of the present disclosure.
Figure 6:
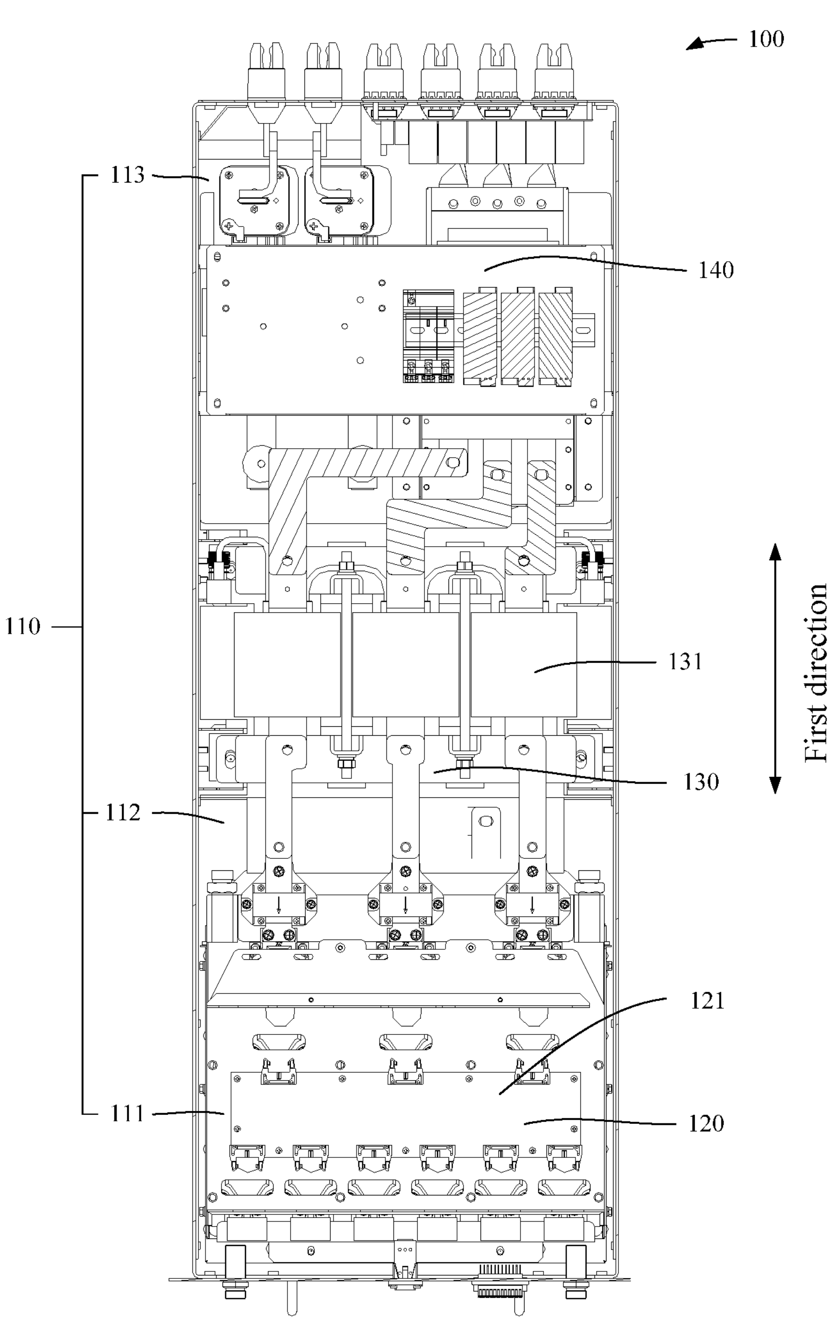
FIG. 6 is a sixth schematic view of a high-power-density modular energy storage converter according to an embodiment of the present disclosure.

Furthermore, the front structure 120 is arranged in the first region 111 of the cabinet 110. As shown in FIG. 3 and FIG. 6, the front structure 120 comprises the power device 121 and the first air-water heat exchanger 122. Specifically, the power device 121 is connected to the foundation slab 114. Optionally, the power device 121 is detachably connected to the foundation slab 114, so as to help an operator to assemble and disassemble the power device 121. The power device is a device formed by the combination of power electronic devices according to certain functions. The first air-water heat exchanger 122 is connected to the power device 121. The first air-water heat exchanger 122 conducts heat dissipation to the components (especially the power device 121) in the front structure 120 in the form of exchanging heat between the air and the water. Optionally, the front structure 120 is an operation panel section of the high-power-density modular energy storage converter 100, and the core component of the high-power-density modular energy storage converter 100. The power device 121 and the first air-water heat exchanger 122 form a whole through a first connecting member and are fixed to the foundation slab 114. Optionally, the first connecting member is a screw or other structures for connection. Optionally, the front structure 120 is arranged symmetrically, and this can ensure the interchangeability between each product.

Figure 4:
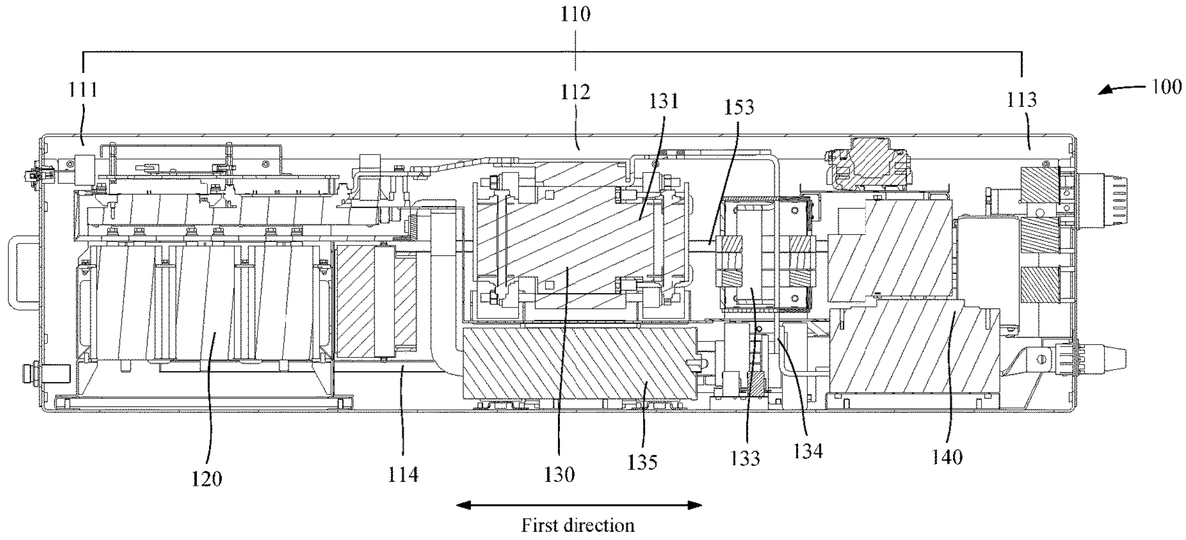
FIG. 4 is a fourth schematic view of a high-power-density modular energy storage converter according to an embodiment of the present disclosure.

Furthermore, the middle structure 130 is arranged in the second region 112 of the cabinet 110. As shown in FIG. 3, FIG. 4 and FIG. 6, the middle structure 130 comprises an electric reactor device 131, a DC magnetic ring device 132, an AC magnetic ring device 133 and an AC filter capacitor 135. Specifically, the electric reactor device 131 is connected to the side wall of the cabinet 110. The electric reactor device 131 is connected to the power device 121. An electric reactor is also called an inductor, and widely applied in circuits; due to the effect of electromagnetic induction, the electric reactor has certain inductance, has a function of preventing current changes, and can transform electrical energy into magnetic energy and store the same. Furthermore, the DC magnetic ring device 132 is connected to the foundation slab 114. The AC magnetic ring device 133 is connected to the foundation slab 114. The AC magnetic ring device 133 is connected to the electric reactor device 131. Optionally, the DC magnetic ring device 132 is connected to the foundation slab 114 through its own fixing plate, and the fixing plate is detachably connected to the foundation slab 114 through a second connecting member. Optionally, the second connecting member is a screw or other structures for connection. Optionally, the middle structure 130 further comprises a first supporting member. The first supporting member is connected to the side wall of the cabinet 110. The electric reactor device 131 is connected to the first supporting member through a third connecting member. Optionally, the first supporting member is a supporting corner piece. Optionally, the third connecting member is a bolt or other structures for connection. Optionally, the AC magnetic ring device 133 is connected to the foundation slab 114 through a second supporting member. Optionally, the second supporting member is an insulation piece, and can be a structure such as a rubber block. Furthermore, the AC filter capacitor 135 is connected to the foundation slab 114. The AC filter capacitor 135 is connected to the AC magnetic ring device 133, and the AC filter capacitor 135 is connected to the electric reactor device 131. The AC filter capacitor 135 indicates a filter device mounted at the AC side of an inverter and used for filtering high-order harmonic generated by the inverter, and the AC filter capacitor 135 and the electric reactor device 131 jointly constitute an LC filter. Through disposing the LC filter, the total harmonic content generated by the inverter can be decreased. Optionally, the AC filter capacitor 135 is connected to a third copper bar 153 between the AC magnetic ring device 133 and the electric reactor device 131 through a cable.

Figure 5:
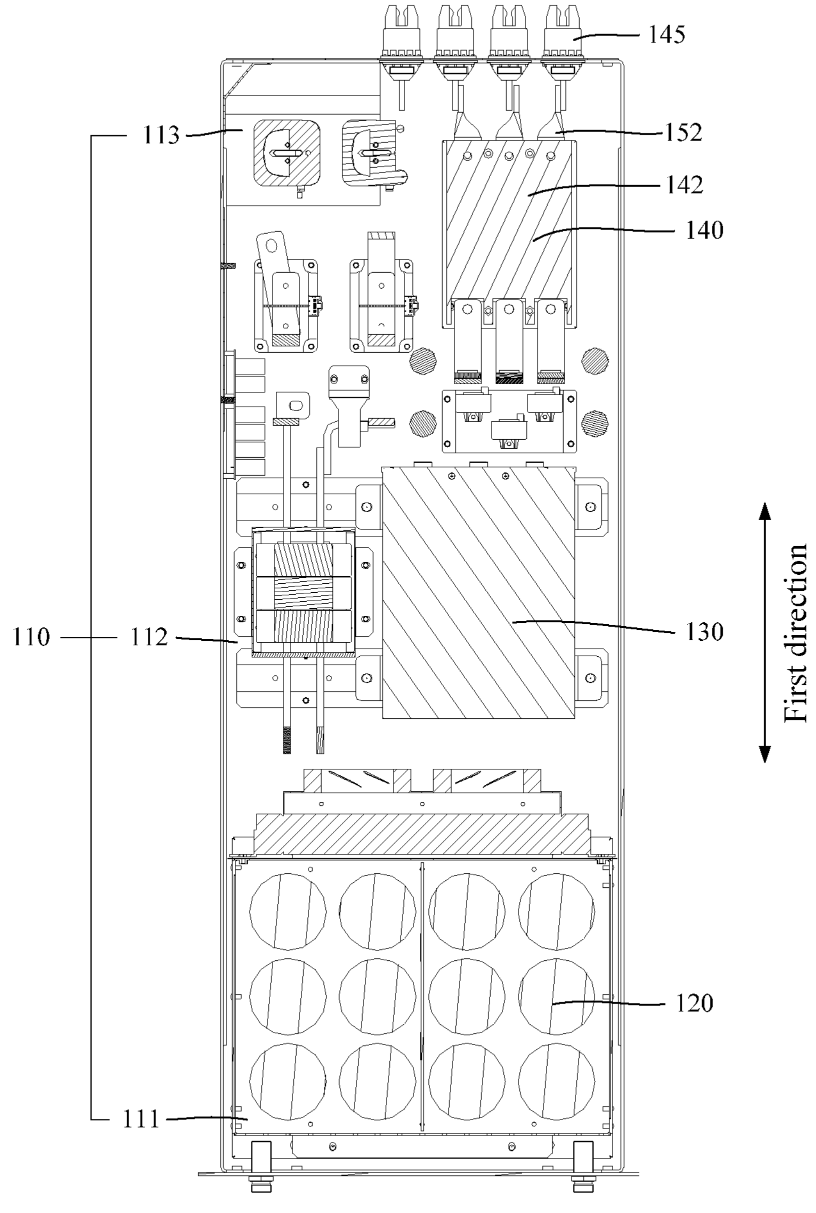
FIG. 5 is a fifth schematic view of a high-power-density modular energy storage converter according to an embodiment of the present disclosure.

Furthermore, the rear structure 140 is arranged in the third region 113 of the cabinet 110. As shown in FIG. 3 and FIG. 5, the rear structure 140 comprises a DC contactor 141, an AC circuit breaker 142, an AC pluggable connector 144, a DC fast fuse device 146 and a DC pluggable connector 145. Specifically, the DC contactor 141 is connected to the foundation slab 114. The DC contactor 141 is connected to the power device 121 through the first copper bar 151. The first copper bar 151 penetrates through the DC magnetic ring device 132. The DC contactor 141 is designed especially for breaking off the DC. When the DC is broken off, the arc light does not have temporary extinguishing when the AC crosses zero, and thus a special device for extinguish the arc light is designed inside the DC contactor. The first copper bar 151 is connected to the power device 121 through a fourth connecting member, and the first copper bar 151 is connected to the DC contactor 141 through the fourth connecting member. Optionally, the fourth connecting member is a bolt or other structures for connection.

Furthermore, the AC circuit breaker 142 is connected to the foundation slab 114. The AC circuit breaker 142 is connected to the electric reactor device 131. The AC circuit breaker 142 is connected to the AC magnetic ring device 133. The AC circuit breaker 142 is a device for protecting its outlet, and cuts off a fault current when the outlet side fails. Optionally, the AC magnetic ring device 133 has a second copper bar 134. The electric reactor device 131 is connected to the second copper bar 134 through at least one copper bar structure. The AC circuit breaker 142 is connected to the second copper bar 134.

Furthermore, the AC pluggable connector 144 is connected to the cabinet 110. The AC pluggable connector 144 is connected to the AC circuit breaker 142. Optionally, the AC pluggable connector 144 and the AC circuit breaker 142 are connected to each other through a first soft connection 152 and form an AC lead-in return circuit. A soft connection is a copper braided wire soft connection or a copper braided belt soft connection. Furthermore, the DC fast fuse device 146 is connected to the DC contactor 141. The DC fast fuse device 146 is a fast fuse. The fast fuse is used for overcurrent and short circuit protection, and can be quickly disconnected in the case of fuse overload. Furthermore, the DC pluggable connector 145 is connected to the cabinet 110. The DC contactor 141, the fast fuse (the DC fast fuse device 146) and the DC pluggable connector 145 constitute the DC lead-in return circuit.

In the technical solution defined in the present disclosure, firstly, the cabinet 110 is divided into the first region 111, the second region 112 and the third region 113, and the front structure 120, the middle structure 130 and the rear structure 140 are respectively arranged in the corresponding regions, by optimizing the spatial layout, the structures and the components become more compact therebetween, which is beneficial for reducing the overall volume of the energy storage converter and improving the power density per unit volume; secondly, through replacing a conventional air-cooling structure with the air-water heat exchanger, and replacing a disconnector and a contactor in a conventional structure with the AC circuit breaker 142, the structure of the energy storage converter is more compact, and this helps further reduce the overall volume of the energy storage converter, and improve the power density of unit volume. The power density (power-to-weight ratio) refers to the ratio of the output power of the battery to its weight.

In some embodiments, optionally, as shown in FIG. 4, the AC magnetic ring device 133 comprises the second copper bar 134, the second copper bar 134 is connected to the electric reactor device 131, and the second copper bar 134 is connected to the AC circuit breaker 142. Through disposing the second copper bar 134, it is convenient for an operator to assemble and disassemble the AC magnetic ring device 133 with the electric reactor device 131, and to assemble and disassemble the AC magnetic ring device 133 with the AC circuit breaker 142.

In some technical solutions, optionally, as shown in FIG. 4, the electric reactor device 131 is connected to the AC magnetic ring device 133 through the third copper bar 153, and the AC filter capacitor 135 is connected to the third copper bar 153 via a cable. Through disposing the third copper bar 153, it is achieved that the electric reactor device 131, the AC magnetic ring device 133 and the AC filter capacitor 135 are in a connected state.

In some technical solutions, optionally, as shown in FIG. 3, the rear structure 140 further comprises a second air-water heat exchanger 143. Specifically, the second air-water heat exchanger 143 is connected to the side wall of the cabinet 110 through a lightning protection mounting plate 147. The second air-water heat exchanger 143 conducts heat dissipation to the components in the rear structure 140 in the form of exchanging heat between the air and the water.

In some embodiments, optionally, as shown in FIG. 3, the high-power-density modular energy storage converter 100 further comprises a liquid-cooled cooling pipeline system 160. Specifically, the liquid-cooled cooling pipeline system 160 is connected to the power device 121. The liquid-cooled cooling pipeline system 160 is connected to the electric reactor device 131. The liquid-cooled cooling pipeline system 160 communicates with the power device 121 and the electric reactor device 131 to cool them. The liquid-cooled cooling pipeline system 160, and the first air-water heat exchanger 122, the second air-water heat exchanger 143 and an air duct partition which are responsible for internal circulation constitute an internal air-cooling circulation loop, and then the ambient temperature for air operation inside the energy storage converter is maintained. Each component is in a suitable environmental condition to ensure that it does not produce power reduction due to temperature changes. Through optimizing the internal air duct, the air circulation is smoother, and this effectively lowers the ambient temperature inside the energy storage converter, and enables the components to work effectively.

In some embodiments, optionally, the middle structure 130 further comprises the first supporting member. The first supporting member is connected to the side wall of the cabinet 110. The electric reactor device 131 is connected to the first supporting member via the third connecting member. Optionally, the first supporting member is the supporting corner piece. Optionally, the third connecting member is a bolt or other members for connection.

In some embodiments, optionally, the middle structure 130 further comprises the second supporting member. The second supporting member is connected to the foundation slab 114. The AC magnetic ring device 133 is connected to the second supporting member. Through disposing the second supporting member, it helps improve the connection strength between the AC magnetic ring device 133 and the foundation slab 114.

Optionally, the second supporting member is an insulation member.

In some embodiments, optionally, as shown in FIG. 3, the DC fast fuse device 146 is connected to the DC contactor 141 via a fourth copper bar 154. Through disposing the fourth copper bar 154, the connection between the DC fast fuse device 146 and the DC contactor 141 can be achieved.

In some embodiments, optionally, the AC pluggable connector 144 is connected to the AC circuit breaker 142 through the first soft connection 152. Through disposing the first soft connection 152, it can prevent the copper braided belt or a copper braided wire from interfering other components, and ensure that the AC pluggable connector 144 and the AC circuit breaker 142 are in a connected state.

According to the embodiments of the high-power-density modular energy storage converter provided by the present disclosure, firstly, the cabinet is divided into the first region, the second region and the third region, and the front structure, the middle structure and the rear structure are respectively arranged in the corresponding regions, by optimizing the spatial layout, the structures and the components become more compact therebetween, which is beneficial for reducing the overall volume of the energy storage converter and improving the power density per unit volume; secondly, through replacing a conventional air-cooling structure with the air-water heat exchanger, and replacing a disconnector and a contactor in a conventional structure with the AC circuit breaker, the structure of the energy storage converter is more compact, and this helps further reduce the overall volume of the energy storage converter, and improve the power density of unit volume.

In the present disclosure, the terms of "first", "second" and "third" are used only for the purpose of description and shall not be understood to indicate or imply any relative importance, unless otherwise clearly defined; the term of "multiple" indicates two or more, unless otherwise explicitly specified or defined. The terms "connected to", "mounting", "fix" and the like should be understood in a broad sense, for example, the term "connected to" can be a fixed connection, a detachable connection, or an integral connection, and can be a direct connection or an indirect connection through an intermediate medium. For a person skilled in the art, they may understand the specific meanings of the above-mentioned terms in the present disclosure according to specific circumstances.

In the specification of the present disclosure, the orientation or position relations indicated by the terms of "upper", "lower", "left", "right", "front", "rear" and the like are based on the orientation or position relations shown in the accompanying drawings, and they are just intended to conveniently describe the present application and simplify the description, and are not intended to indicate or imply that the devices or units as indicated should have specific orientations or should be configured or operated in specific orientations, and then should not be construed as limitations to the present application.

In the description of the present specification, the descriptions of the phrases "one embodiment", "some embodiments" and "specific embodiments" and the like mean that the specific features, structures, materials or characteristics described in combination with the embodiment(s) or example(s) are included in at least one embodiment or example of the present disclosure. In the specification, the schematic representation of the above phrases does not necessarily refer to the same embodiment or example. Moreover, the particular features, structures, materials or characteristics described may be combined in a suitable manner in any one or more of the embodiments or examples.

The descriptions above are only some embodiments of the present disclosure, and are not used to limit the present disclosure. For a person skilled in the art, the present disclosure may have various changes and variations. Any modifications, equivalent substitutions, improvements, etc. made within the spirit and principle of the present disclosure shall all be included in the protection scope of the present disclosure.

What is claimed is:

1. A high-power-density modular energy storage converter comprising:

- a cabinet, wherein the cabinet is divided into a first region, a second region and a third region, wherein the first region, the second region and the third region are arranged successively along a first direction, wherein the cabinet comprises:
  - a foundation slab, wherein at least a portion of the foundation slab is arranged in the first region, at least a portion of the foundation slab is arranged in the second region, and at least a portion of the foundation slab is arranged in the third region;
- a front structure arranged in the first region, wherein the front structure comprises:
  - a power device connected to the foundation slab; and
  - a first air-water heat exchanger connected to the power device;
- a middle structure arranged in the second region, wherein the middle structure comprises:
  - an electric reactor device connected to the side wall of the cabinet, wherein the electric reactor device is connected to the power device;
  - a DC magnetic ring device connected to the foundation slab;
  - an AC magnetic ring device connected to the foundation slab, wherein the AC magnetic ring device is connected to the electric reactor device; and
  - an AC filter capacitor connected to the foundation slab, wherein the AC filter capacitor is connected to the AC magnetic ring device, wherein the AC filter capacitor is connected to the electric reactor device; and
- a rear structure arranged in the third region, wherein the rear structure comprises:
  - a DC contactor connected to the foundation slab, wherein the DC contactor is connected to the power device through a first copper bar, wherein the first copper bar penetrates through the DC magnetic ring device;
  - an AC circuit breaker connected to the foundation slab, wherein the AC circuit breaker is connected to the AC magnetic ring device;
  - an AC pluggable connector connected to the cabinet, wherein the AC pluggable connector is connected to the AC circuit breaker;
  - a DC fast fuse device connected to the DC contactor; and
  - a DC pluggable connector connected to the cabinet, wherein the DC pluggable connector is connected to the DC fast fuse device.

2. The high-power-density modular energy storage converter according to claim 1, wherein the AC magnetic ring device has a second copper bar, the second copper bar is connected to the electric reactor device, and the second copper bar is connected to the AC circuit breaker.

3. The high-power-density modular energy storage converter according to claim 1, wherein the electric reactor device is connected to the AC magnetic ring device through the third copper bar, and the AC filter capacitor is connected to the third copper bar via a cable.

4. The high-power-density modular energy storage converter according to claim 1, wherein the rear structure further comprises:

- a second air-water heat exchanger, connected to the side wall of the cabinet through a lightning protection mounting plate.

5. The high-power-density modular energy storage converter according to claim 1, wherein the number of the power device is at least one.

6. The high-power-density modular energy storage converter according to claim 1, further comprising:

- a liquid-cooled cooling pipeline system connected to the power device, wherein the liquid-cooled cooling pipeline system is connected to the electric reactor device.

7. The high-power-density modular energy storage converter according to claim 2, further comprising:

- a liquid-cooled cooling pipeline system connected to the power device, wherein the liquid-cooled cooling pipeline system is connected to the electric reactor device.

8. The high-power-density modular energy storage converter according to claim 3, further comprising:

a liquid-cooled cooling pipeline system connected to the power device, wherein the liquid-cooled cooling pipeline system is connected to the electric reactor device.

9. The high-power-density modular energy storage converter according to claim 4, further comprising:

a liquid-cooled cooling pipeline system connected to the power device, wherein the liquid-cooled cooling pipeline system is connected to the electric reactor device.

10. The high-power-density modular energy storage converter according to claim 1, wherein the electric reactor device is connected to the side wall of the cabinet through a first supporting member.

11. The high-power-density modular energy storage converter according to claim 2, wherein the electric reactor device is connected to the side wall of the cabinet through a first supporting member.

12. The high-power-density modular energy storage converter according to claim 1, wherein the AC magnetic ring device is connected to the foundation slab via a second supporting member.

13. The high-power-density modular energy storage converter according to claim 2, wherein the AC magnetic ring device is connected to the foundation slab via a second supporting member.

14. The high-power-density modular energy storage converter according to claim 1, wherein the DC fast fuse device is connected to the DC contactor via a fourth copper bar.

15. The high-power-density modular energy storage converter according to claim 2, wherein the DC fast fuse device is connected to the DC contactor via a fourth copper bar.

16. The high-power-density modular energy storage converter according to claim 3, wherein the DC fast fuse device is connected to the DC contactor via a fourth copper bar.

17. The high-power-density modular energy storage converter according to claim 1, wherein the AC pluggable connector is connected to the AC circuit breaker through a first oft connection.

18. The high-power-density modular energy storage converter according to claim 2, wherein the AC pluggable connector is connected to the AC circuit breaker through a first soft connection.

19. The high-power-density modular energy storage converter according to claim 3, wherein the AC pluggable connector is connected to the AC circuit breaker through a first soft connection.

20. The high-power-density modular energy storage converter according to claim 4, wherein the AC pluggable connector is connected to the AC circuit breaker through a first soft connection.

* * * * *